(12) United States Patent
Okamoto et al.

(10) Patent No.: US 6,437,284 B1
(45) Date of Patent: Aug. 20, 2002

(54) OPTICAL SYSTEM AND APPARATUS FOR LASER HEAT TREATMENT AND METHOD FOR PRODUCING SEMICONDUCTOR DEVICES BY USING THE SAME

(75) Inventors: Tatsuki Okamoto; Tetsuya Ogawa; Keisuke Furuta; Hidetada Tokioka; Tomohiro Sasagawa; Junichi Nishimae; Mitsuo Inoue; Yukio Sato, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/599,645

(22) Filed: Jun. 23, 2000

(30) Foreign Application Priority Data

Jun. 25, 1999 (JP) .................................. 11-179233

(51) Int. Cl.$^7$ .............................................. B23K 26/06
(52) U.S. Cl. ............................. 219/121.73; 219/121.65; 438/487
(58) Field of Search .................. 219/121.73, 121.75, 219/121.65, 121.66, 121.74; 438/487

(56) References Cited

U.S. PATENT DOCUMENTS

| | | | |
|---|---|---|---|
| 4,315,130 A | * | 2/1982 | Inagaki et al. |
| 4,744,615 A | * | 5/1988 | Fan et al. |
| 4,793,694 A | * | 12/1988 | Liu ........................ 219/121.75 |
| 5,529,951 A | * | 6/1996 | Noguchi et al. ....... 219/121.65 |
| 5,897,799 A | * | 4/1999 | Yamazaki et al. ..... 219/121.75 |
| 6,249,385 B1 | * | 6/2001 | Yamazaki et al. |

FOREIGN PATENT DOCUMENTS

| | | |
|---|---|---|
| JP | 61-61657 | 12/1986 |
| JP | 63-314862 | * 12/1988 |
| JP | 4-33791 | * 2/1992 |
| JP | 10-333077 | 12/1998 |
| JP | 11-16851 | 1/1999 |

OTHER PUBLICATIONS

J. Carvalho et al.; "Nd–YAG Laser Induced Crystallization on a–Si:H Thin Films", *Mat. Soc. Symp. Proc.*, vol. 358, pp. 915–920 (1995).

B. Rezek et al.; "Polycrystalline Silicon Thin Films Produced by Interference Laser Crystallization of Amorphous Silicon", *Jpn. J. Appl. Phys.*, vol. 38, pp. L1083–L1084 (1999).

* cited by examiner

*Primary Examiner*—Geoffrey S. Evans
(74) *Attorney, Agent, or Firm*—Leydig, Voit & Mayer, Ltd.

(57) ABSTRACT

An optical system that controls laser beam spot profile for forming a high performance thin film by a laser heat treatment process is provided. In the optical system that irradiates a rectangular laser beam on a film formed on a substrate, intensity distribution forming, apparatus makes the intensity distribution uniform in the longitudinal direction while maintaining the properties of the laser beam 2 such as directivity in the direction of shorter side, making it possible to concentrate the light to a limit permitted by the nature of the laser beam and achieve the maximum intensity gradient on the film disposed on the substrate. Thus a steep temperature distribution can be generated on the film disposed on the substrate and, as a result, high performance thin film can be formed.

17 Claims, 9 Drawing Sheets

OPTICAL SYSTEM AND APPARATUS FOR LASER HEAT TREATMENT AND METHOD FOR PRODUCING SEMICONDUCTOR DEVICES BY USING THE SAME

BACKGROUND OF THE INVENTION

1. Field of the Invention

The present invention relates to an optical system and apparatus for laser heat treatment, and to a method for producing semiconductor devices by laser crystallization by heat-treating a thin silicon thin film formed on a substrate to convert an amorphous or polycrystalline silicon thin film into coarse-grained silicon.

2. Prior Art

The pixel section of a liquid crystal display panel is constituted from thin film switching transistors formed from an amorphous or polycrystalline silicon thin film on a substrate of glass or synthesized quartz. A driver circuit for driving the pixel transistors has been arranged mostly outside the panel, but if such a driver circuit were formed together in the panel, tremendous advantages would be achieved in terms of reliability of the liquid crystal panel with lowered cost of production.

At the present, however, since the active layer of the transistors has been made of a silicon thin film of low crystallinity, the thin film transistor has poor performance exemplified by low mobility, thus making it difficult to incorporate an integrated circuit having the required high-speed operation and high performance to the display panel.

It has been found that crystallinity of thin film silicon and carrier mobility in the thin film transistors formed therefrom are related to each other, as described below. Thin film silicon for the pixel transistors has been obtained by laser heating of amorphous silicon for crystallization, which is generally polycrystalline having a great number of lattice defects concentrated in the grain boundaries of the crystallized silicon thin film which significantly impede carrier mobility in the active layer of thin film transistors. In order to improve mobility in the thin film transistors, such measures are taken as reducing the number of times the carriers cross the grain boundaries in the process of migration in the active layer, and decreasing the concentration of lattice defects.

Techniques to improve crystallinity of thin film silicon include heat treating with laser beam for providing higher mobility for thin film transistors. A purpose of the heat treating is to enlarge crystal grains and lessen lattice defects in the grain boundaries of the silicon thin films.

Attempts of heat treatment with laser have been reported by B. Rezeck in Jpn. Journal Appl. Phys. vol. 38 (1999) pp. L1083–L1084 2nd part No.10A, and by J. Carvalho, et al. in Mat. Res. Soc. Symp. Proc., Vol.358, 1995, pp915–920. Laser light used in the works reported in these references is the second harmonic (wavelength 532 nm of light) generated by an Nd:YAG laser. FIG. 12 shows such an example of laser heat treatment apparatus that includes an optical system for laser heat treatment using the second harmonic of an Nd:YAG laser. An oscillator 1 in the apparatus uses the second harmonic (wavelength 532 nm) generated by an Nd:YAG laser, which is a representative pulsed laser source of visible light used for the heat treatment application. A laser beam 2 from the laser apparatus is focused by a condenser lens 4 to irradiate and heat an amorphous or polycrystalline silicon thin film 5 which has been previously deposited on a substrate 7 via a base layer 6. The amorphous silicon layer 5 in the irradiated area is fused by the heat generated by the pulse laser beam 2, and is then cooled to crystallize into coarse-grained silicon layer on the substrate.

According to the reports quoted above, the conventional laser beam has a profile characterized by a rotationally symmetrical Gaussian distribution at the point of irradiation, thus causing crystal grains to grow in radial directions in a rotationally symmetrical pattern, as shown in FIG. 13, in the crystallization process of the molten silicon. Consequently, since the polycrystalline silicon thin film has very poor uniformity within the plane after heat treatment with a laser beam, there has been reported no attempt of producing thin film transistors with this technique.

Meanwhile, an excimer laser having shorter wavelength has been used in heat treatment utilizing a linear beam profile. This is based on a completely different concept from that of heat treatment with laser light of a wavelength not shorter than 330 nm. Since the heat treatment with laser light of a wavelength not shorter than 330 nm causes crystalline growth of the molten silicon within the plane, namely in the horizontal directions as described above, it is employed for forming large crystal grains. On the other hand, since heat treatment with an excimer laser beam causes crystal growth in the direction of film thickness (vertical direction), it is employed merely for the purpose of improving the uniformity of the film quality within plane after heat treatment with a laser beam and improving the productivity, not for the purpose of growing large grains.

An optical system for forming a linear beam profile from a laser beam generated by an excimer laser is disclosed in Japanese Patent Publication Nos. 11-16851 and 10-33307. The laser beam emitted by the excimer laser oscillator is, after passing a cylindrical lens array arranged in two directions intersecting at right angles with each other in a plane perpendicular to the optical is of the beam, concentrated by a focusing lens and is processed by a beam homogenizer that equalizes the intensity distribution in two directions, resulting in converging widths that are different in the two directions.

In a heat treatment using a laser beam that has a rectangular cross section, the light intensity distribution profile must be optimized in order to produce thin film transistors having excellent characteristics. This is because the intensity distribution profile in the beam width direction has especially great effect on the growing process of crystals, and the distribution in the longitudinal direction governs the region where the crystal grow. However, the conventional optical systems used for forming linear beams do not allow selection of a proper profile in the direction of width. Also because the beam is homogenized in two perpendicular directions, it has not been possible to converge the linear beam to an extremely small width.

SUMMARY OF THE INVENTION

The present invention has been made to solve the problems described above. An object of the present invention is to provide an optical system that controls a light intensity distribution of laser beam into a optimized profile for producing excellent crystallinity in a thin film with coarse crystal grains and reduced lattice defects which is required for producing high performance of thin film transistors.

Another object of the present invention is to provide an optical system for achieving a laser beam shape of extremely narrow rectangular shape suitable to relatively scan the beam across a thin film on the substrate and a very steep light intensity distribution in the direction of scanning the film surface.

Still another object of the present invention is to provide a laser heat-treating apparatus for forming excellent crystallinity of a thin film silicon required for producing high performance for thin film silicon transistors.

A further object of the present invention is to provide a method of producing a thin film semiconductor of excellent crystallinity required for producing higher performance thin film transistors.

An optical system for laser heat treatment according to the present invention includes an intensity distribution forming means for controlling the light intensity distribution of a laser beam emitted by a laser oscillator for the purpose of heat-treating a film material formed on a substrate by irradiating laser light thereon, and a beam shape forming means for forming a rectangular beam shape on a film on the substrate. The intensity distribution forming means makes uniform distribution of the light intensity of the laser beam emitted from the laser oscillator in one direction within the cross section of the beam, while maintaining the primary intensity distribution of the laser beam as emitted by the laser oscillator to the other direction perpendicular to the former direction, and then the beam shape forming means changes the beam having such intensity distribution from the intensity distribution rig forming means into a beam rectangular in cross section and projects this laser beam onto the film material to be heated. The beam shape forming means may enlarge and/or reduces the beam profile in the one direction and/or in the other direction before passing through the beam shape forming means to achieve uniform heating of the film material.

The optical system of the invention enables possible control of the temperature distribution on the film and achieves a laser beam spot profile for uniform heating.

An intensity distribution forming means in the present invention may cause a part of the laser beam reflected a plurality of times in one direction in the cross section of the laser beam, and combines the reflected part and straight passing part of the laser beam, thereby to form a uniform light intensity distribution of the beam. Such an intensity distribution forming means preferably may includes a pair of reflecting planes opposed to each other with a distance therebetween.

The intensity distribution forming means may employ a waveguide structure for limiting a spread of a primary laser beam having a Gaussian energy distribution along only one direction in the cross section of the laser beam, thereby to form uniform intensity distribution to said direction. The intensity distribution forming means may also use a waveguide having a pair of reflecting planes which are opposed to each other and parallel or tapered to the direction.

Another intensity distribution forming means may employ a pair of separated cylindrical lens with a distance therebetween which are separated in one direction in the cross section of the laser beam, to focus parts of the beam to the one direction and straiten in the other perpendicular direction, thereby to form a uniform intensity distribution to the one direction while maintaining the Gaussian distribution in the other direction.

On the other hand, a beam shape forming means in the invention functions to project the beam having uniform intensity distribution in the one direction from the intensity distribution forming means onto a film to be heated on the substrate. Also, in projecting the beam, the beam shape forming means may be arranged in such a configuration that a uniform intensity distribution obtained from the intensity distribution forming means in the one direction is transferred with a suitable rectangular shape to the film, thereby to determine a shape of the longitudinal direction of the rectangular beam projected on the film. As a example of a simple beam shape forming means, a transfer lens such as a spherical lens may be used for transferring.

Further, the beam shape forming means may also focus the laser beam emitted by the from the intensity distribution forming means onto the film only in at least one direction in the cross section of the beam, thereby determining the profile of the direction of the shorter side of the rectangular beam spot on the film. The beam shape forming means may be a condenser lens that is used to focus the light onto the film. A cylindrical lens may be used for the condenser lens. In this lens configuration, a steep light intensity distribution may be determined in the direction of the shorter side of the rectangular beam shape on the film on the substrate.

The beam shape forming means may also include a combination of plurality of cylindrical lenses and/or spherical lenses. These configurations can form a uniform intensity distribution in the direction of longer side of the rectangular beam shape on the film on the substrate as well as a steep light intensity distribution may be formed in the direction of the shorter side, while irradiating laser beam of any desired shape. All or some of the plurality of cylindrical lenses or spherical lenses may be aspherical lenses. The light intensity distribution in the direction of the shorter side of the rectangular beam shape on the film can be made steep up to the limit permitted by directivity nature of the laser beam.

The optical system for laser heat treatment of the present invention may include a knife edge fitted in proximity to the film in parallel to the direction of the longer side of the rectangular beam shape on the film. The knife edge is capable of defining the beam shape and making the light intensity distribution steeper.

In the invention, the optical system may preferably use a pulsed laser for heating a thin film applied on a substrate. Particularly, the optical system for laser heat treatment may be provided with a pulse width extension means which separates a primary pulsed laser beam emitted form a oscillator into at least two different optical paths having different path lengths, and thereafter overlap the partial beams in a single path to extend a range of laser plus time. Such a pulse width extension means may be arranged anywhere between the laser oscillator and a beam shape forming means, or, in some case, just in front of the substrate. Since pulse width of the laser can readily be established, duration of the crystal growth can be controlled according to different thickness of thin films.

The invention includes an apparatus for laser crystallization comprising the optical system for laser heat treatment described above and a stage that mounts a substrate on which the thin film have been applied. In particular, the apparatus of the present invention can be applied to production of semiconductor devices wherein the optical system scans the laser beam of rectangular cross section irradiated on the surface of a semiconductor film such as thin film silicon, applied on a substrate, continuously heating and cooling the surface to form coarse crystal grains in the semiconductor film during melting and crystallizing process.

The semiconductor film may be prepared of amorphous or polycrystalline silicon thin film deposited on the substrate. The coarse-grained silicon thin films fabricated by this method can be widely applied for producing thin film transistors for visual signal processing use.

A laser oscillator in the laser heat treatment apparatus of the present invention may generate a laser beam having wavelength in a range from 330 nm to 800 nm; this wavelength allows thin film silicon to be heated uniformly in the direction of thickness of the silicon thin film.

BRIEF DESCRIPTION OF THE DRAWINGS

The present invention will be described in more detail below with reference to the accompanying drawings, in which.

PREFERRED EMBODIMENTS OF THE INVENTION

Figure 1A:
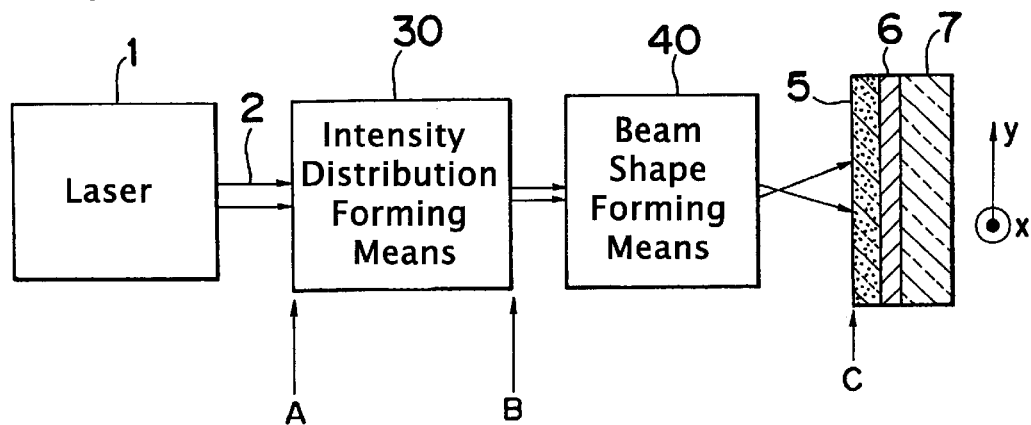
FIG. 1A shows an schematic diagram of an optical system for laser heat treatment according to the present invention.

FIG. 1A shows a schematic configuration of an optical system for laser heat treatment of the invention. The optical system includes a laser oscillator 1, an intensity distribution forming means 30 and an beam shape forming means 40, which are arranged so that a laser beam 2 emitted from the laser oscillator 1 passes through the intensity distribution forming means 30 and the beam shape forming means 40, while the beam shape forming means 40 is positioned so that the beam converges on the surface of a silicon thin film 5 to be crystallized, as a thin film material, applied on a substrate 7.

Figure 1B:
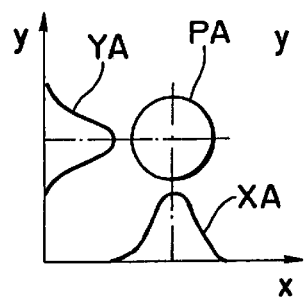
FIGS. 1B to 1D show light intensity distributions in x and y directions and beam sectional shapes at each part of a intensity distribution forming means and a beam shape forming means of the optical system shown in FIG. 1A.

Typically, the laser beam 2 as emitted from the laser oscillator 1 has a Gaussian distribution in a manner that beam shape PA is circular at an beam entrance plane A of the intensity distribution forming means 30, while both intensity distribution XA in x direction at Plan A and intensity distribution YA in y direction—orthogonal to the x direction—at plane A are substantially Gaussian distributions, as shown in FIG. 1B.

Figure 1C:
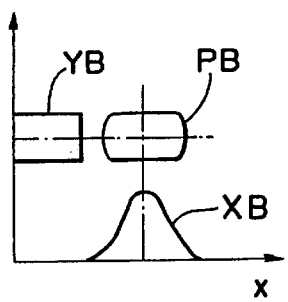

According to the present invention, the intensity distribution forming means 30 maintains the Gaussian profile of the intensity distribution in x direction and smoothes the intensity distribution only in the y direction, namely, forming a rectangular distribution. As a result—beam shape PB at an exit plane B of the intensity distribution forming means 30 is converted to a substantially rectangular shape as shown in FIG. 1C. Intensity distribution XB in x direction at the plane B is maintained the same as the intensity distribution XA in the x direction at the plane A, and intensity distribution YB in the y direction at the plane B is formed in substantially a top hat shape.

Figure 1D:
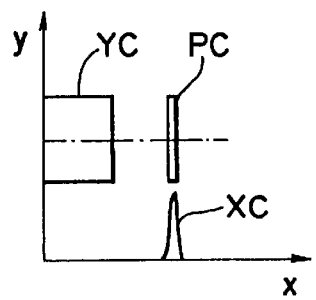

The laser beam that has passed the intensity distribution forming means 30 is extended or depressed by the beam shape forming means 40 with desired magnitude in the x and y directions to obtain a beam of rectangular shape as shown in FIG. 1D, which is irradiated on the silicon thin film 5 on the substrate 7. Namely, the beam shape forming means reduces and/or enlarges the dimension of the laser beam received from the intensity distribution forming means in the x direction and/or the y direction to form a rectangular elongated beam shape which is small in the x direction and large in the y direction on the film surface projected.

The beam of such a rectangular shape is irradiated onto the silicon thin film 5 while being scanned relatively to the thin film 5, thereby heat the film surface continuously. When the direction of width for beam cross section rectangle is defined as x direction and the longitudinal direction is defined as y direction (referring to FIGS. 1C to 1D and FIG. 2), beam shape PC on film surface C on the substrate has such a profile as the intensity distribution XC in the x direction on plane C is a reduction of the intensity distribution XA in x direction on the plane A, with the high directivity of the laser beam 2 being maintained while the intensity distribution YC in y direction on plane C is made substantially uniform.

A target to be irradiated with the rectangular laser beam may be a silicon thin film previously applied on a substrate. The substrate 7 may be fabricated glass or ceramics, and has a base layer of silicon dioxide formed thereon. The base layer of silicon oxide may be formed to a thickness of about 200 nm using chemical vapor deposition (CVD) technique.

As a silicon thin film, amorphous or polycrystalline silicon may deposited on the base layer to a thickness of about 50–100 nm, typically, 70 nm by low pressure chemical vapor deposition(LPCVD) or other deposition techniques.

The film may be made of material other than silicon-based material, such as amorphous germanium, which is formed to a coarse-grained crystalline germanium thin film.

In an application of the optical system of the present invention, the substrate 7 is preferably placed on a movable stage. In this case, the thin film surface is irradiated with the laser beam while making relative movement in the x direction by moving the stage with respect to the fixed optical system. Alternatively, the laser beam from the optical system may be scanned relative to the substrate 7 on a stationary stage by using a proper scanning equipment for sweeping the beam.

Figure 2:
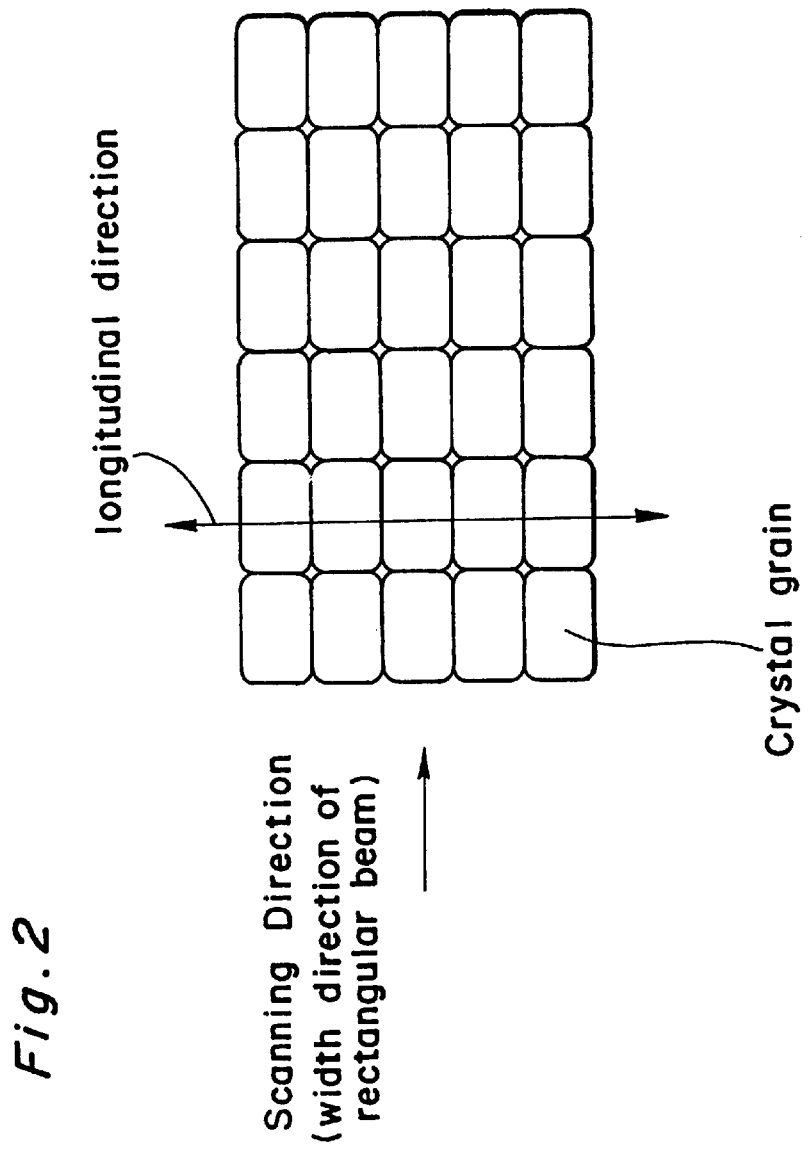
FIG. 2 shows a schematic configuration of crystallized grains of a thin film of silicon after laser heat treatment by scanning with a rectangular-shaped laser beam using the optical system for laser heat treatment according to the present invention.

When the film material 5 applied on the substrate is irradiated with the laser beam which is moving at a constant rate, the film material 5 is heated through absorption of the laser light and is melted in a rectangularly irradiated area corresponding to the cross section of the moving beam. At this time, temperature gradient is not generated in the longitudinal direction of the rectangular beam spot, i.e., in y direction, since the intensity distribution of the laser beam 2 is uniform in this direction, with rather great temperature gradient generated only in x direction. As the beam spot is going way from a heated area, the molten area gradually is cooled and then crystal growth proceeds along the direction of temperature gradient, thus resulting in one-dimensional growth in moving direction of the laser beam, i.e., in x direction, which leads to the formation of crystal grains as large as several micrometers. As shown in FIG. 2, crystal grains of the polycrystalline thin film silicon formed by this laser crystallization treatment are coarsened and oriented in the direction of shorter side of the beam cross section, which is the direction of crystal growth, i.e., in the direction of moving the movable stage.

The process of crystal growth in x direction is heavily influenced by the temperature gradient along x direction in the film 5, corresponding to the light intensity distribution in the width direction of the rectangular beam cross section irradiated thereon. Heat generated in the thin film 5 on the substrate by the laser beam is dissipated uniformly into the substrate. This means that temperature in the film on the substrate decreases monotonously along x direction. Crystal growth proceeds horizontally from a portion where the film temperature has lowered earlier below the melting point, to a portion where the film temperature lowers later below the melting point. And the crystal growth in the x direction is stopped by fine grains generated by natural nucleation as the temperature lowers. Thus, satisfactory coarsening crystal growth can be achieved provided that sufficiently long crystals can be grown in a relatively long period of time within which the natural nucleation can take place, which requires a high crystal growing rate.

The crystal growing rate v in a region x is related to the temperature gradient $\Delta T/\Delta x$ in the region by the following equation.

$$V = k \Delta T / \Delta x$$

where $\Delta x$ is infinitesimal length of the region in x direction, $\Delta T$ is the temperature difference across the infinitesimal length, and k is a proportionality constant. A sharper temperature gradient to the x direction at a temperature near the melting point in a region increases crystal growth rate, thereby enabling large crystal grains to form in the crystallized polycrystalline silicon thin film to obtain high crystallinity which is required for producing the high-performance, thin film transistors.

Since in the optical system described above the intensity distribution in width direction of the beam cross section is capable of maintaining high directivity of the laser beam, the light can be concentrated up to the limit imposed by the nature of the laser beam 2 so as to obtain the maximum gradient in the light intensity on the thin film 5. This enables control of any desired intensity distribution of laser beam under the maximum gradient, thereby controlling temperature distribution in x direction in the film 5 on the substrate.

The optical system of the present invention preferably employs a laser having an oscillation wavelength in a range from 330 nm to 800 nm. Light of a wavelength in this range, in applying to the film 5 made of amorphous or polycrystalline silicon thin film, can penetrate inside the thin film due to a relatively low absorption coefficient by the amorphous silicon, and therefore achieves substantially uniform heating. Horizontal temperature distribution in the silicon thin film due to the irradiation with laser is formed only in the x direction. As a result, a portion of the film 5 on the substrate made of the amorphous or polycrystalline silicon thin film that corresponds to a portion of the beam having light intensity not less than a certain level is molten throughout the depth.

A solid state laser harmonic generator is preferably used as a laser having an oscillation wavelength in a range from 330 nm to 800 nm. Second harmonics (532 nm) or third harmonics (355 nm) of an Nd:YAG laser, second harmonics (524 nm) or third harmonics (349 nm) of an Nd:YLF laser, or second harmonic (515 nm) or third harmonic (344 nm) of an Yb:YAG laser may be used. A fundamental wave or second harmonic of a Ti: sapphire laser may also be used.

Solid state laser harmonic generators may preferably be used to obtain efficient laser light in the above wavelength range using a compact apparatus and to continue stable operation for a long period of time. Using the harmonics generators can heat amorphous or polycrystalline silicon thin film so uniformly in a direction of thickness as to create coarsely grown grains in the film, and reliably perform high crystallinity with reduced lattice defects in the silicon thin film. Thus this optical system and apparatus can provide laser beam profiles capable of uniformly forming high-quality thin film.

Moreover, the optical system of the present invention is capable of heat-treating a silicon oxide film that is an insulating film, in addition to semiconductor materials, thereby improving the quality thereof. The optical system is applicable also to such uses as heat treatment of an ITO film, that is a light transmitting electrically conductive film, with laser thereby to improve the performance thereof through crystallization and increase the density. Further the optical system is applicable to heat treatment of various thin films for improving the performance of the film on the substrate to absorb laser light.

Embodiment 1

Figure 3A:
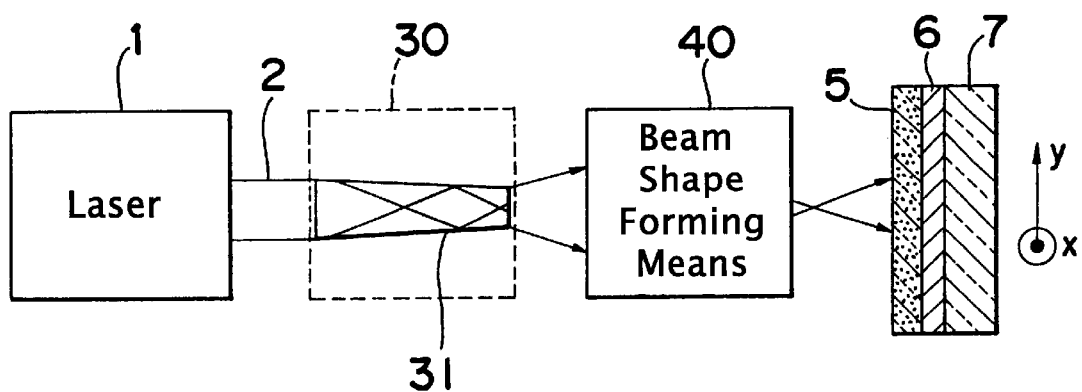
FIG. 3A shows an optical system for laser heat treatment according to an embodiment of the present invention, particularly intensity distribution forming means for the x direction.
Figure 3B:
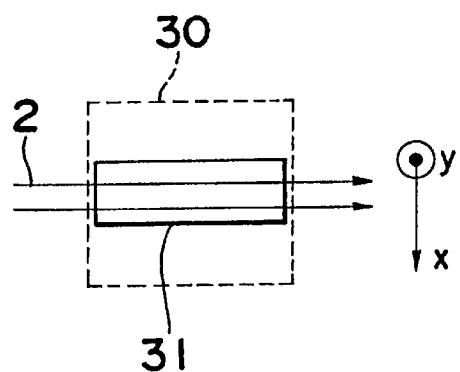
FIG. 3B shows a part of the optical system of FIG. 3A and shows intensity distribution forming means for the y direction.

FIGS. 3A and 3B show an optical system for laser heat treatment of an embodiment of the present invention, wherein an intensity distribution forming means 30 comprises a light transmitting element or waveguide that has totally reflecting planes. The intensity distribution forming means 30 may employ a light transmitting element with a pair of reflecting planes opposite to each other, for example, a wedge-shaped transparent element 31 made of a light transmitting material. Another light transmitting element or lightguide may use a pair of tapered or parallel mirrors opposed to each other with a distance slightly narrower than a diameter of the primary laser beam.

Description shows an example of using the wedge-shaped transparent element 31. The wedge-shaped element 31 is a tapered transparent block formed in the shape of a wedge, with the dimension in y direction decreasing toward the tip as shown in FIG. 3A, and the reflecting planes are separated at a distance slightly narrower than a diameter of the gaussian distribution of the primary laser beam, whereas, as shown in FIG. 3B, the dimension in x direction remains enough wide and constant to pass the laser beam.

The wedge-shaped element has a function to reflect only a y-directional outer part of the primary laser beam 2, which is emitted from the laser oscillator 1, incident on the wider surface of the block, by both tapered planes in y direction of the block. Thus, only the outer part of the laser beam 2 is reflected from peripheral reflecting planes with respect to y direction, and the light reflected on the peripheries is combined with the light from the middle portion passing between the reflecting planes at the emerging surface on the narrower end of the wedge-shaped element 31, thereby forming a substantially uniform intensity distribution. In x direction, on the other hand, the laser beam 2 is output while maintaining the directivity thereof due to the width of the wedge-shaped element 31 being made larger than the width of the laser beam 2.

In the configurations described above, the laser beam spot profile can be obtained for forming high-quality crystallized thin film uniformly in the area direction easily by heat treatment with laser.

The wedge-shaped element 31 may comprise, instead of the light transmitting block described above, a hollow body having a pair of mirrors disposed to oppose each other in an inclined configuration such as said wedged reflecting planes, with similar effects to those described above.

Embodiment 2

Figure 4A:
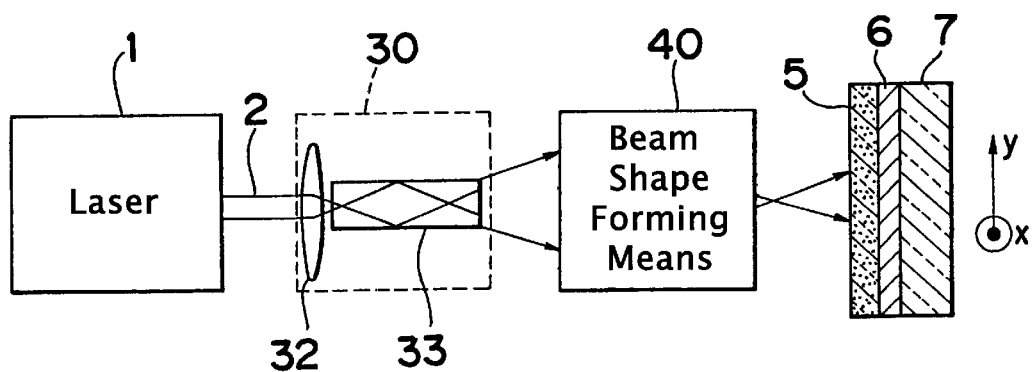
FIG. 4A shows an optical system for laser heat treatment according to another embodiment of the present invention, particularly intensity distribution forming means for the x direction.
Figure 4B:
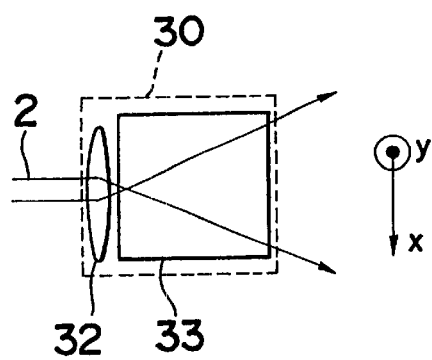
FIG. 4B shows a part of the optical system of FIG. 4A and shows intensity distribution forming means for the y direction.

In this embodiment shown in FIGS. 4A and 4B, the intensity distribution forming means employs a condenser lens 32 and a waveguide 33 consisting of a pair of reflecting planes disposed to oppose each other in front of the lens 32.

The waveguide 33 may comprise a light transmitting block having two totally reflecting planes opposed to each other, or a pair of mirrors opposed to each other.

For the condenser lens 32 which focuses the laser beam emitted by the oscillator into the waveguide 33, a spherical convex lens or a cylindrical convex lens may be used to converge or diverge in y direction the light into a waveguide.

An example of the intensity distribution forming means 30 is a combination of a spherical lens used as the lens 32 and a narrow light emitting block used as the waveguide 33. In this example, a pair of wide surfaces perpendicular to y direction of the block are used as totally reflecting planes.

The laser beam 2 emitted from the laser oscillator 1 is introduced by the convex lens 32 into the block of the waveguide 33 which is a block having a pair of surfaces perpendicular to y direction disposed substantially parallel to each other, and therefore the laser beam 2 that is introduced by the convex lens 32 into the block and diverged in y direction is totally reflected on the pair of surfaces. As a result, the laser beam 2 is reflected from peripheries with respect to y direction, while light reflected on the peripheries and light from the middle portion are combined at the exit of the waveguide 33, thereby forming a substantially uniform intensity distribution. In x direction, on the other hand, the laser beam 2 is output while maintaining the directivity thereof due to the width of the waveguide 33 being made larger than the width of the laser beam 2.

According to the optical system described above, in a simple configuration of the intensity distribution forming means the desirable laser beam spot profile can be obtained for forming a uniformly coarse-crystallized thin film silicon having high quality easily.

Embodiment 3

Figure 5A:
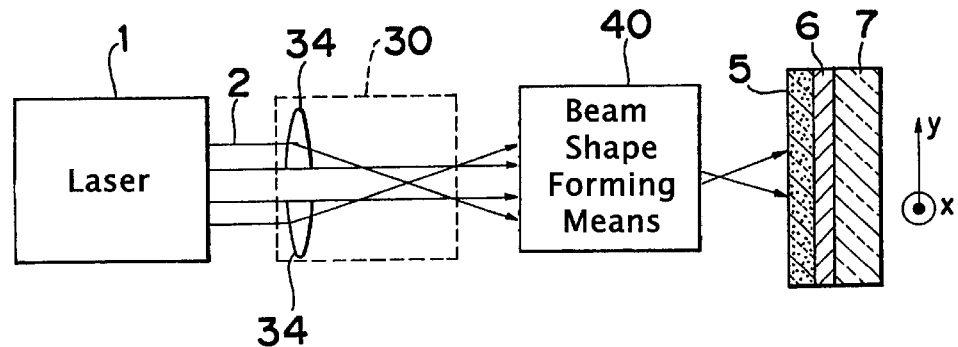
FIG. 5A shows an optical system for laser heat treatment according to another embodiment of the present invention, particularly intensity distribution forming means for the x direction.
Figure 5B:
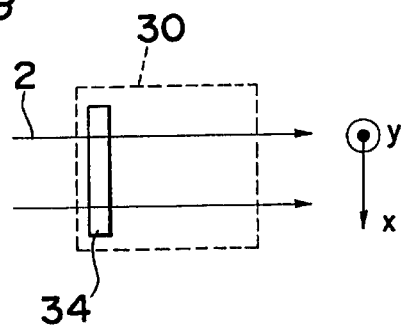
FIG. 5B shows a part of the optical system of FIG. 5A and shows intensity distribution forming means for the y direction.

In another embodiment, the intensity distribution forming means 30 of the optical system for laser heat treatment comprises separated cylindrical lenses 34 that consist of two semi-cylindrical lenses, which are two halves obtained by dividing a single cylindrical lens at the center thereof, spaced from each other as shown in FIGS. 5A and 5B.

As shown in FIG. 5A, the separated cylindrical lenses 34 and 34 separated along y direction are disposed with the longitudinal direction thereof being disposed in x direction. The laser beam 2 emitted by the laser oscillator 1 is separated into a peripheral radiant fluxes refracted by the semi-cylindrical lenses and a middle radiant flux that passes straight between the two semi-cylindrical lenses. The separated radiant fluxes are combined with the middle radiant flux at the entrance of the beam shape forming means 40 to form a substantially uniform intensity distribution. In x direction, on the other hand, the laser beam 2 is output while maintaining the directivity thereof due to the width of the separated cylindrical lenses 34 being made larger than the width of the laser beam 2.

With the intensity distribution forming means having the configuration as described above, the laser beam spot profile can be obtained for forming a uniform thin film having high quality with reduced loss of laser light by the laser heat treatment process.

Embodiment 4

Figure 6:
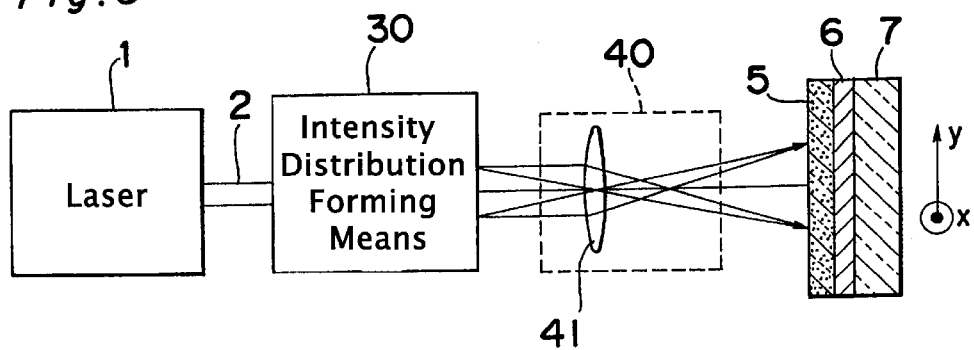
FIG. 6 shows an optical system for laser heat treatment according to another embodiment of the present invention.

The fourth embodiment shows a specific example of the beam shape forming means 40 which includes a transfer lens 41. The transfer lens 41 may be either a single lens or a combination of a plurality of lenses. The example shown in FIG. 6 depicts the transfer lens 41 where a single convex lens is used as the beam shape forming means 40.

As shown by the first through fourth embodiments, the intensity distribution forming means 30 transforms the shape of the laser beam 2 emitted by the laser oscillator 1 into substantially rectangular shape and, while maintaining the intensity distribution in x direction same as the intensity distribution of the laser beam 2, forms the intensity distribution YB in y direction in top hat shape. The transfer lens 41 as the beam shape forming means 40 irradiates the film 5 on the substrate with the laser beam while reducing or expanding the intensity distribution of the beam obtained by means of the intensity distribution forming means 30.

The beam shape forming means described above is capable of forming the beam with an intensity distribution that is uniform in y direction, and can irradiate the film 5 formed from amorphous or polycrystalline silicon thin film on the substrate with the laser beam, that has the intensity distribution in x direction, and scanning it in x direction. During heat treatment with laser, the laser beam spot profile can be obtained for forming a uniform thin film having high quality with a simple configuration.

Embodiment 5

Figure 7:
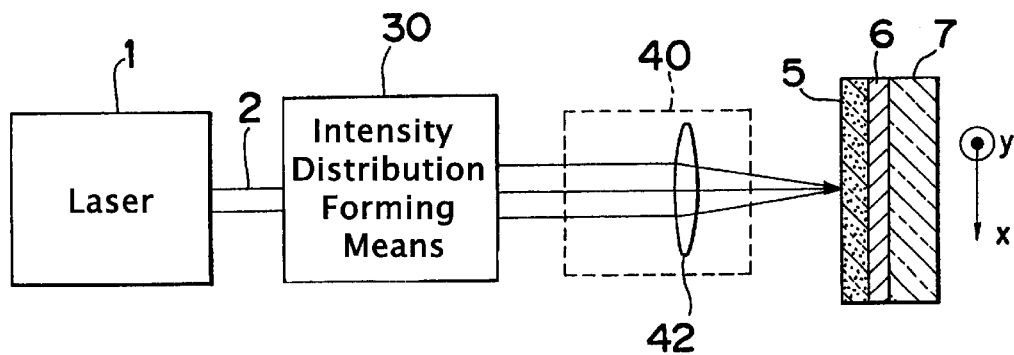
FIG. 7 shows an optical system for laser heat treatment according to an embodiment of the present invention.

As a special example of the beam shape forming means 40 consisting of a single lens described in the fourth embodiment, a lens that concentrates the light only in one direction can be used. FIG. 7 shows such an example of condenser lens comprising a cylindrical lens. The condenser lens may be either a single lens or a combination of a plurality of lenses.

As described above, the intensity distribution forming means 30 transforms the shape of the laser beam 2 emitted by the laser oscillator 1 into substantially rectangular shape and, while maintaining the intensity distribution in x direction same as the intensity distribution of the laser beam 2, forms the intensity distribution in y direction in top hat shape.

According to this embodiment, the beam formed in the rectangular shape is concentrated only in x direction of the intensity distribution obtained with the intensity distribution forming means 30 by the condenser lens 42 that is the beam shape forming means 40 thereby irradiating the film 5 on the substrate with the laser beam.

Since laser light can be concentrated by the beam shape forming means that employs the condenser lens to a limit permitted by the property of the laser beam 2 such as directivity in x direction, gradient of the laser light irradiation intensity can be made steep and the film 5 on the substrate made of amorphous or polycrystalline silicon thin film can be irradiated with the laser light, thereby making it possible, during heat treatment with laser, to obtain the laser beam spot profile for forming a uniform thin film having high quality with a simple configuration.

Embodiment 6

Figure 8A:
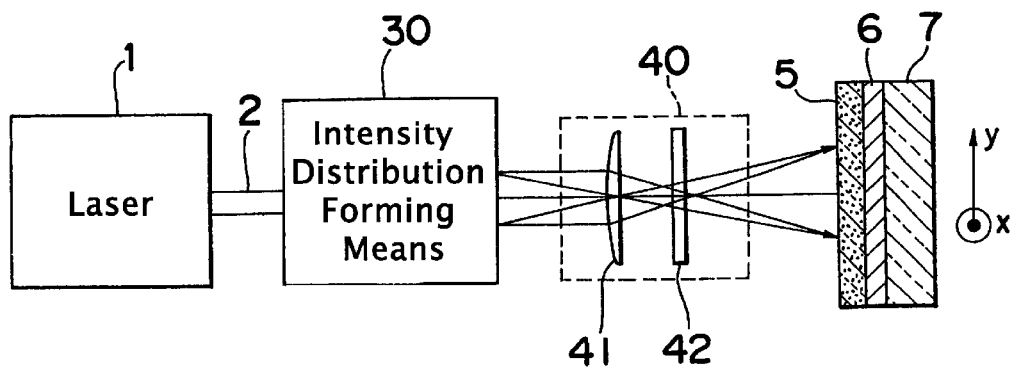
FIG. 8A shows an optical system for laser heat treatment according to the embodiment of the present invention, particularly intensity distribution forming means for the y direction.
Figure 8B:
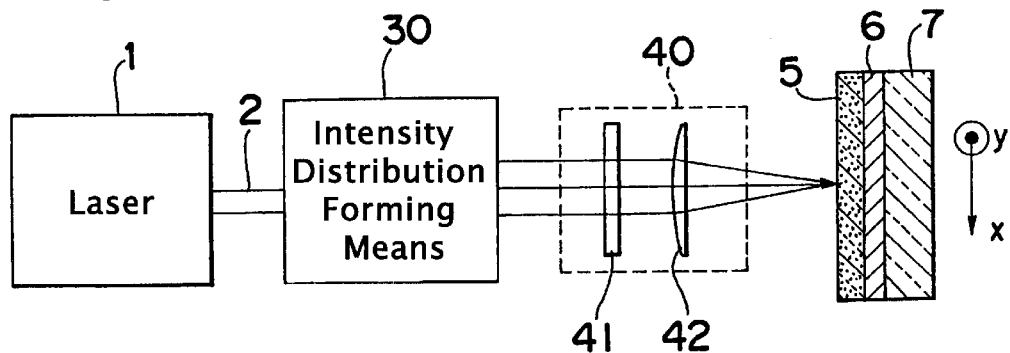
FIG. 8B is a view similar to FIG. 8A, showing intensity distribution forming means for the x direction.

FIGS. 8A and 8B show an embodiment of the optical system for laser heat treatment, wherein the beam shape forming means 40 comprising the transfer lens of the fourth embodiment and the condenser lens of the fifth embodiment.

The laser beam 2 emitted by the laser oscillator 1 is maintained by the intensity distribution forming means 30 to have the intensity distribution in x direction similar to the intensity distribution of the laser beam 2, and the intensity distribution in y direction is formed in top hat shape. The laser beam that has been formed in the rectangular shape is concentrated only in x direction of the intensity distribution obtained with the intensity distribution forming means 30 by the condenser lens 42 that is the beam shape forming means 40 and the intensity distribution in y direction obtained with the intensity distribution forming means 30 is freely reduced or enlarged by the transfer lens 41 that is the beam shape forming means 40, thereby irradiating the amorphous or polycrystalline silicon thin film 5 with the laser beam.

Since the configuration described above makes it possible to form uniform intensity distribution in y direction and concentrate the laser light to a limit permitted by the nature of the laser beam 2 such as directivity in x direction, gradient of the laser light irradiation intensity can be made steep and the film 5 on the substrate made of amorphous or polycrystalline silicon thin film can be irradiated with the laser light, so that the linear laser beam spot profile can be formed for forming a uniformly coarse-crystallized thin film silicon having high crystallinity with the laser heat treatment process.

According to this embodiment, each of the transfer lens 41 and the condenser lens 42 constituting the beam shape forming means 40 may be a combination of a plurality of lenses or, alternatively, any of the lenses may serve as the transfer lens and the condenser lens.

Embodiment 7

Figure 9A:
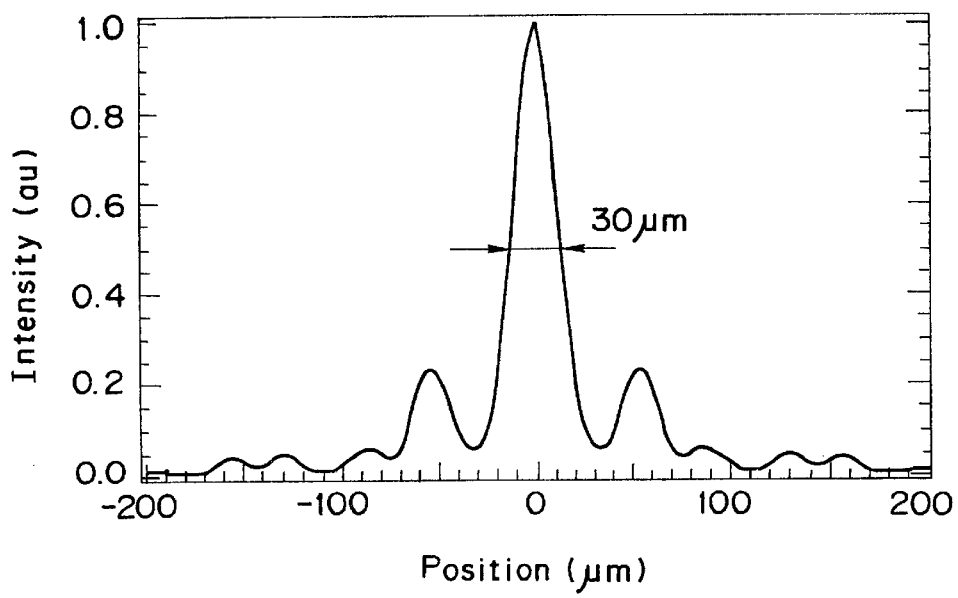
FIGS. 9A and 9B are graphs showing light intensity distributions on an amorphous or polycrystalline silicon thin film according to an embodiment of the present invention.
Figure 9B:
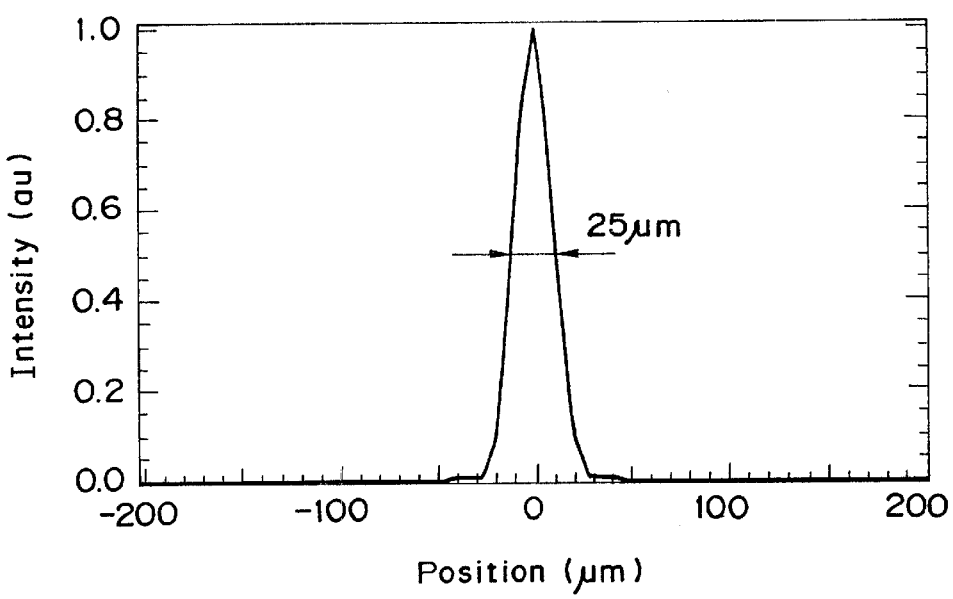

FIGS. 9A and 9B show intensity distributions in x direction on the thin film 5 calculated in the case of a spherical (cylindrical) lens and an aspherical lens used, respectively, for the condenser lens 42 of the beam shape forming means 40 in the sixth embodiment.

In this embodiment, the cylindrical surface of the cylindrical condenser lens 42 is made in a shape deviated from cylindrical surface, and this cylindrical lens is called an aspherical cylindrical lens.

Assuming that the condenser lens 42 has focal length of, for example, 100 mm and laser beam having a width of 40 mm in x direction is incident on the condenser lens 42, if the condenser lens 42 is spherical, the beam can be concentrated to about 30 μm in half beam width on the film 5 on the substrate as shown in FIG. 9A, although the beam spreads up to the periphery. Under this assumption, if the condenser lens 42 is aspherical, the beam can be concentrated to about 25 μm in half beam width on the film 5 on the substrate as shown in FIG. 9B, and the spread of the beam to the periphery can be suppressed; consequently, gradient of the intensity distribution can be made greater than that of a spherical lens.

With the configuration described above, gradient of the laser light irradiation intensity can be made further sharper, thereby obtaining the laser beam spot profile for forming a uniformly coarse-crystallized thin film silicon having higher crystallinity in the simple configuration with the laser heat treatment process.

Although this embodiment shows use of the aspherical lens for the condenser lens 42 only, similar effects can be achieved also by using the aspherical lens for the other lens.

Embodiment 8

Figure 10:
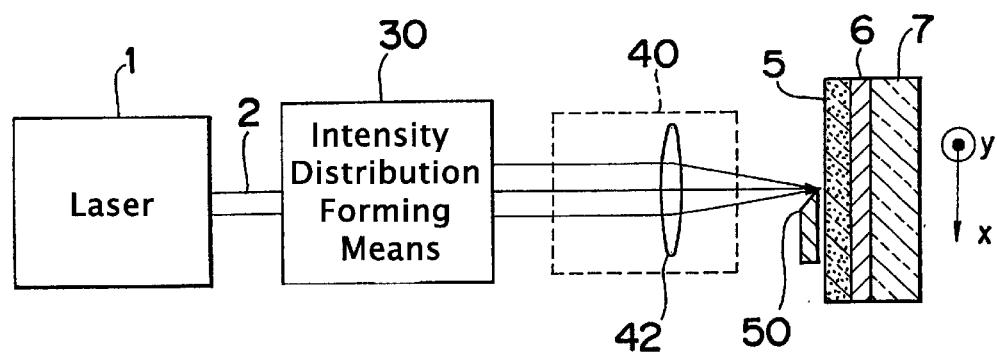
FIG. 10 shows an optical system for laser heat treatment according to another embodiment of the present invention.

FIG. 10 shows this embodiment that is an example of placing a knife edge 50 in front of the beam shape forming means 40.

The knife edge 50 is placed in the vicinity of the film 5 on the substrate for cutting off a part of the beam. By cutting off a part of the beam incident on the film 5 on the substrate in x direction with the knife edge 50, the laser beam having infinite gradient of light intensity can be irradiated on the film 5 on the substrate.

The use of the knife edge 50 as described above makes it possible to make the gradient of the laser light irradiation intensity infinitely steep, so that the laser beam spot profile for forming a uniform thin film having high quality can be obtained reliably during heat treatment with laser.

Embodiment 9

This embodiment is the optical system for laser heat treatment employing pulse width extension means 60 that is disposed between the laser oscillator and the intensity distribution forming means 30 for elongating and controlling the pulse width of the pulsed laser.

Figure 11:
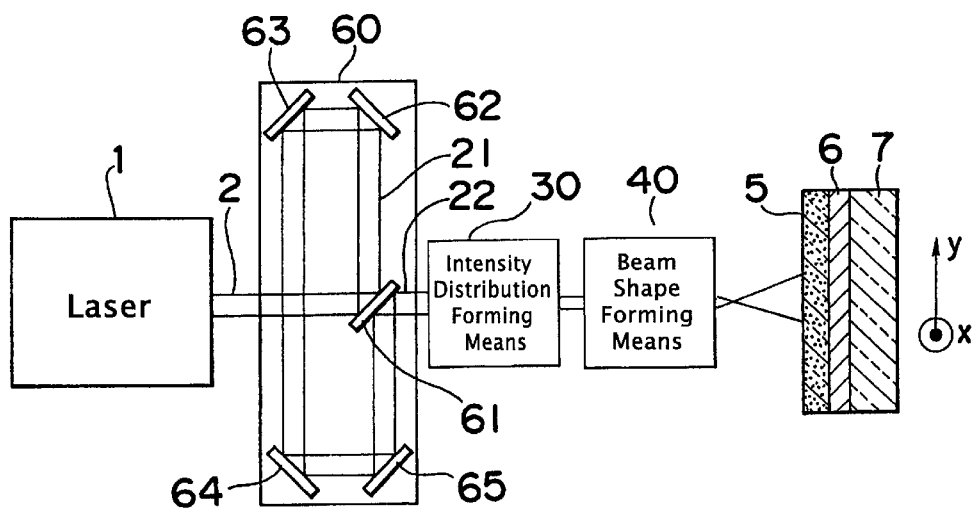
FIG. 11 shows an optical system for laser heat treatment according to further embodiment of the present invention.
Figure 12:
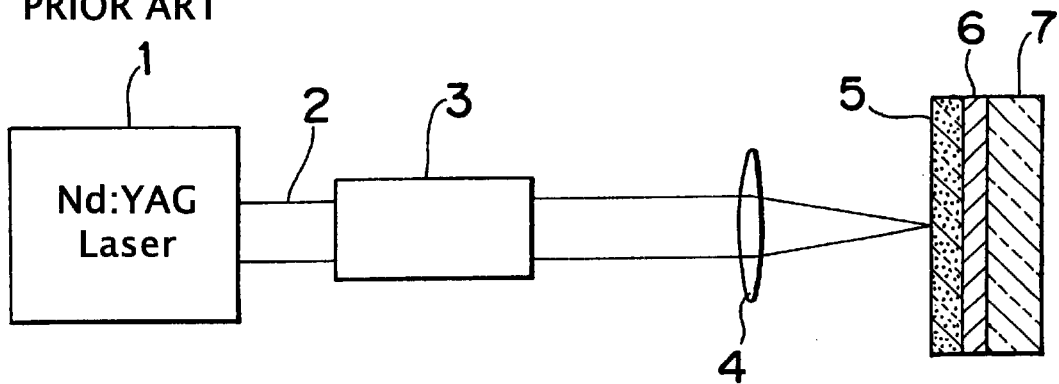
FIG. 12 is a schematic diagram showing a laser heat treatment apparatus including an optical system for laser heat treatment of the prior art.
Figure 13:
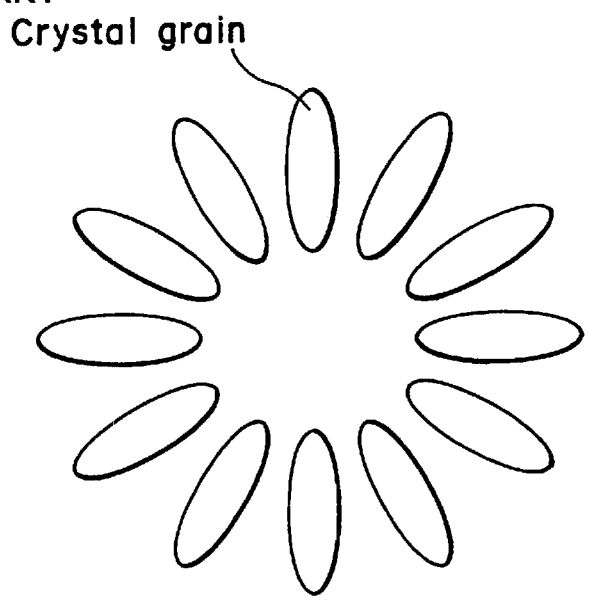
FIG. 13 is a schematic diagram showing the layout of crystalline grains of a silicon thin film formed by heat treatment with a laser beam having a rotationally symmetrical Gaussian profile according to the prior art.

In the pulse width extension means shown in FIG. 11, a beam splitter 61 is disposed on the optical axis of the laser beam from the laser oscillator. First to fourth total reflector mirrors 62, 63, 64, 65 are located at the corners of a rectangle so that when a beam emitted from the laser oscillator 1 enters a part of reflection on the beam splitter is reflected on these mirrors to form a loop and returns to the beam splitter 61 after being reflected on the last total reflector mirror 65.

The pulse width extension means 60 is constituted from the single beam splitter and an optical loop comprising three or more total reflector mirrors. The laser beam 2 is separated into two partial beams by the beam splitter 61, with one partial beam going straight to enter the intensity distribution forming means 30. Other part of the partial laser beam reflected on the beam splitter 61 is reflected successively on the first total reflector mirror 62, the second 63, the third 64 and then the fourth 65, thereby to experience a delay, before reentering the beam splitter 61 to be multiplexed with the strait part of laser beam that has passed the beam splitter 61 and to enter the intensity distribution forming means 30. Synthesis with the delayed beam can extend the pulse width of the total laser beam, thereby allowing duration of laser irradiation per pulse to change depending on properties of the silicon thin film 5 having deposited on the substrate. Thus, Using the pulse width extension means, time period per pulse can be adapted to the optimum grain growth conditions for larger crystal grains of the crystallized silicon. In this manner, the pulse width extension means has advantages of controlling the pulsed heat duration of crystal growing process, allowing a variety of thin films different in thickness to be changed to high crystallinity to provide a uniformly coarse-crystallized thin film silicon.

What is claimed is:

1. An optical system for laser beam heat-treating of a film on a substrate by irradiating the film with a laser beam, comprising:

a single intensity distribution forming means for regulating light intensity distribution in a cross section of a laser beam emitted by a laser oscillator; and beam shape forming means for forming a rectangular beam shape on the film on the substrate, wherein the single intensity distribution forming means generates a uniform intensity distribution of the laser beam in a y direction of the beam cross section, perpendicular to an optical axis of the laser beam, while maintaining in an x direction, perpendicular to the y direction, in the beam cross section an intensity distribution and directivity of the laser beam substantially identical to the laser beam as emitted from the laser oscillator; and the beam shape forming means changes a dimension of the laser beam received from the intensity distribution forming means in at least one of the x direction and the y direction to form a rectangular beam shape that is smaller in the x direction than in the y direction on the film surface.

2. The optical system according to claim 1, wherein the intensity distribution forming means comprises a pair of reflecting planes opposed to each other and spaced apart in the y direction at a distance to multiplex a part of the laser beam reflected from both reflecting planes to produce multiplexed lights a remainder of the laser beam passing between the pair of reflecting planes, while the multiplexed light is introduced into the beam shape forming means.

3. The optical system according to claim 2, wherein the intensity distribution forming means comprises a waveguide in which the pair of reflecting planes are transverse to the y direction and are parallel to the x direction.

4. The optical system according to claim 1, wherein the intensity distribution forming means includes a pair of semicircular cylindrical lenses spaced apart in the y direction and extending in the x direction to synthesize a part of the laser beam from the laser oscillator refracted by the cylindrical lenses and a part of the laser beam passing between the cylindrical lenses, and feeding a synthesized beam to the beam shape forming means.

5. The optical system according to claim 1, wherein the beam shape forming means comprises a transfer lens for transferring onto the thin film on the substrate the laser beam of the uniform intensity distribution in the y direction produced by the intensity distribution forming means, the transfer lens projecting an elongated profile in the y direction of the rectangular beam onto the film.

6. The optical system according to claim 5, wherein the beam shape forming means comprises a combination of lenses selected from the group consisting of cylindrical lenses and spherical lenses.

7. The optical system according to claim 6, wherein at least some of the lenses are aspherical lenses.

8. The optical system according to claim 1, wherein the beam shape forming means includes a condenser lens which concentrates only the light intensity distribution in the x direction, the condenser lens condensing the laser beam onto the thin film.

9. The optical system according to claim 1, wherein the optical system further includes a knife edge located in proximity to the thin film on the substrate for cutting off a part of the laser beam incident on the thin film in the x direction.

10. The optical system according to claim 1, wherein the optical system further includes pulse width extension means splitting a pulsed laser beam emitted by the laser oscillator into two parts different in path lengths, multiplexing the two parts into a multiplexed beam and introducing the multiplexed beam into one of the light intensity forming means and the beam shape forming means.

11. An apparatus for laser heat treatment comprising the optical system for laser heat treatment according to claim 1 and a stage for mounting of the substrate, wherein the laser beam having a rectangular cross section supplied from the optical system is scanned over the surface of the film on the substrate in the x direction, heating and cooling the film on the substrate continuously.

12. The apparatus according to claim 11, wherein the laser oscillator is a pulsed laser oscillator which produces a laser beam having a wavelength in a range from 330 nm to 800 nm.

13. The apparatus according to claim 12, wherein the laser oscillator is a solid state laser oscillator which generates harmonics.

14. The apparatus according to claim 11, wherein the film is an amorphous or polycrystalline silicon film deposited on the substrate for crystallization to produce a coarse-grained polycrystalline film silicon.

15. A method of producing semiconductor devices having a semiconductor thin film by using the optical system for laser heat treatment according to claim 1, wherein the method comprises scanning a surface of a semiconductor film on the substrate in the x direction with the laser beam having a cross section generated by the optical system, and heating and cooling the surface continuously to produce coarse crystalline grains in the semiconductor film.

16. The method according to claim 15, wherein the laser oscillator of the optical system for laser heat treatment is a pulsed laser oscillator that produces a laser beam with at a wavelength in a range from 330 nm to 800 nm.

17. The method according to claim 15, wherein the semiconductor film is an amorphous or polycrystalline silicon film deposited on the substrate.

* * * * *